United States Patent [19]

Van Ooijen et al.

[11] Patent Number: 4,489,357
[45] Date of Patent: Dec. 18, 1984

[54] MAGNETIC SENSOR HAVING MULTILAYERED FLUX CONDUCTORS

[75] Inventors: Johannes A. C. Van Ooijen, Asperen; Robertus D. J. Verhaar, Eindhoven, both of Netherlands

[73] Assignee: U.S. Philips Corporation, New York, N.Y.

[21] Appl. No.: 371,039

[22] Filed: Apr. 23, 1982

[30] Foreign Application Priority Data

May 1, 1981 [NL] Netherlands ............................ 8102148

[51] Int. Cl.³ ............................ G11B 5/12; G11B 5/25
[52] U.S. Cl. .................................... 360/113; 360/119; 360/122
[58] Field of Search ...................... 360/113, 119, 122; 336/32 R; 324/252

[56] References Cited

U.S. PATENT DOCUMENTS 3,921,217  11/1975  Thompson ........................ 360/113

FOREIGN PATENT DOCUMENTS 52-9413  1/1977  Japan .................................. 360/113

Primary Examiner—John H. Wolff
Attorney, Agent, or Firm—Joseph P. Abate

[57] ABSTRACT

A magnetic sensor (1) includes a magneto-resistive element (3) which magnetically bridges a gap (15) between two magnetic flux conductors (6,7). In order to reduce the noise level and higher harmonic distortion of the sensor, each of the flux conductors (6,7) includes at least two layers (16,18) of magnetically permeable materials having substantially the same composition between which a layer (17) is present which has a different composition.

5 Claims, 2 Drawing Figures

MAGNETIC SENSOR HAVING MULTILAYERED FLUX CONDUCTORS

BACKGROUND OF THE INVENTION

The invention relates to a magnetic sensor comprising a generally flat and elongate magneto-resistance element which at two oppositely located ends has contacts for the connection to a source of measuring current, which element shows a magnetic anisotropy in which the easy axis of magnetization lies in the major plane of the element, the sensor further comprising two magnetically permeable components situated in one plane between which components a gap is present which gap is bridged magnetically by the magneto-resistance element, the sensor furthermore comprising a body of magnetically permeable material disposed parallel to the two components, the body having one end coupled magnetically to an end of a first of the two components remote from the gap, an end of the second of the magnetically permeable components remote from the gap being adapted to be brought in a flux coupling relationship with an external magnetic field.

The invention relates, in particular to magnetic sensors which may be used to detect magnetic fields of magnetic recording media, for example, magnetic tapes or disks.

A geometric arrangement of a magneto-resistance element bridging a gap between two magnetically permeable elements is known from U.S. Pat. No. 3,921,217. In itself, a magneto-resistance element may be of the magnetically biased type in which it is necessary, for linearizing the playback characteristic of the magneto-resistance element, to apply a static magnetic field so as to move the operating point to a linear region of the resistance-magnetic field curve, or it may be a current-biased type magneto-resistance element. This current-biased type is a magneto-resistance element in which one or more inclined and electrically readily conductive strips are provided on one of the element surfaces at an angle of approximately 45° with the longitudinal axis of the element. These strips serve as equipotential strips so that the direction of the current in the element which is at right angles to the equipotential strips encloses an angle of also approximately 45° with the easy axis of magnetization. In this manner, the transmission characteristic is linearized.

In a sensor of the above-described type having two magnetically permeable components separated by a gap (so-called flux conductors) which together with a further magnetically permeable element or return limb form a partially open magnetic circuit, the free (second) magnetically permeable component as it were "sucks" the flux of a presented magnetic field and couples it to the magneto-resistance element, after which the flux is returned via the first magnetically permeable component and the magnetically permeable element.

For a high sensitivity, that is to say for an optimum coupling of the presented flux from one flux conductor to the magneto-resistance element and, thence, to the other flux conductor, it is important that the distance between the magneto-resistance element and the flux conductors should be kept as small as possible.

As said distance becomes smaller, the noise in the output signal of the magneto-resistance element, however, increases as does the harmonic distortion. When said distance is increased, noise and distortion decrease but the sensitivity also decreases.

SUMMARY OF THE INVENTION

It is the object of the invention to provide a magnetic sensor of the type described in the opening paragraph which combines a high sensitivity with a low noise and distortion level.

For that purpose, the magnetic sensor according to the invention is characterized in that each of the magnetically permeable components (the flux conductors) includes at least two parallel layers of magnetically permeable materials each having substantially a same first composition, between which parallel layers a layer having a composition different from the first composition is present.

It has been found that noise and distortion are considerably reduced with this construction of the flux conductors, also when the distance between the magneto-resistance element and the flux conductors is very small.

This favorable effect is ascribed to the fact that, due to the laminated construction of the flux conductors, fewer domain walls occur therein than in the flux conductors of the conventional mono-layer magneto-resistance sensors. As a result, fewer or even no domain walls in the overlapping area of the flux conductors with the magneto-resistance element have an interaction with the magneto-resistance element.

For optimum operation of the flux conductors, it is important that the intermediate layer between every two magnetically permeable layers (the flux conductors may comprise, for example, two magnetically permeable layers separated by an intermediate layer, or four magnetically permeable layers in which every two successive layers are separated by an intermediate layer) should be as thin as possible and, hence, the magnetostatic coupling between the magnetically permeable layers should be as large as possible.

For that purpose, it is favorable when the intermediate layer does not exceed a thickness of 50 nm and, preferably, does not exceed a thickness of 10 nm. The intermediate layers may consist of a non-magnetic material. For combination with magnetically permeable layers of Ni—Fe or Ni—Co, for example, Mo is very suitable. The intermediate layers may also consist of a magnetic material provided this has a different (saturation) magnetization and, hence, a different composition. For example, when the Ni—Fe ratio in an Ni—Fe alloy is varied, the magnetization also varies.

A very practical way of realizing an intermediate layer having a different composition proves to be the deposition by electroplating of the magnetically permeable layers and, during the deposition process, to cut off the current through the bath halfway for a short period of time, or to increase or decrease the current strength halfway for a short period of time.

This method also leads to magnetically permeable components which have at least two magnetically permeable layers having a first composition separated by an intermediate layer having a composition slightly different from the first composition.

BRIEF DESCRIPTION OF THE DRAWING

The invention will now be described in greater detail, by way of example, with reference to the accompanying drawing, in which.

DESCRIPTION OF THE PREFERRED EMBODIMENTS

Figure 1:
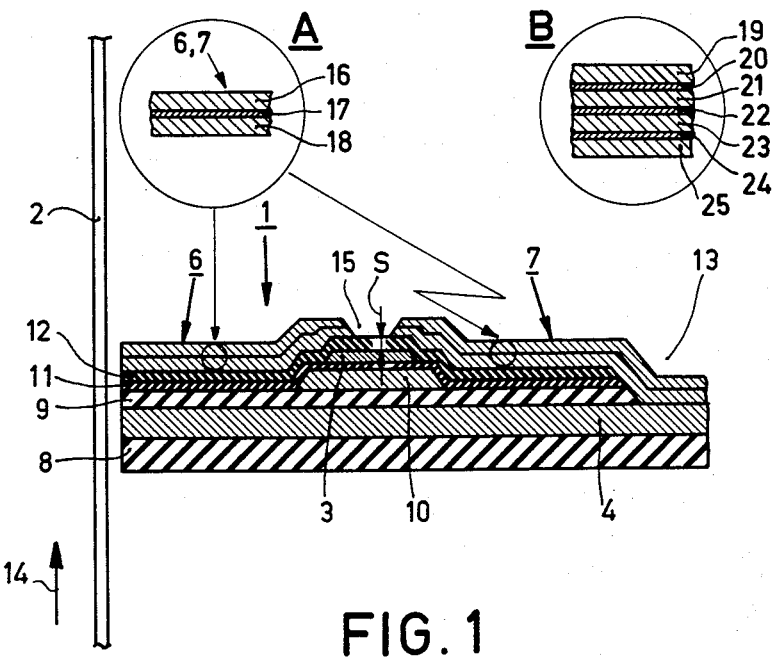
FIG. 1 is a cross-sectional view through a magnetic sensor according to the invention, and FIG. 2 graphically shows the higher harmonic distortion and the noise level of a known magnetic sensor compared with that of a magnetic sensor according to the invention as recorded by means of a spectrum analyzer.

FIG. 1 shows a magnetic sensor 1 which serves to detect magnetic fields originating from a magnetic recording medium 2 which is moved past the sensor 1 in the direction of an arrow 14. The detection of said fields occurs by measuring the relative resistance variation of a magneto-resistance element 3 to which magnetic flux is applied via a magnetically permeable component 6 (so-called flux conductor) which is situated opposite to one edge thereof, while the magnetic flux is returned to the recording medium via a magnetically permeable component 7 which is located opposite to its other edge and a magnetically permeable element 4 coupled to the component 7.

If desired, the sensor according to the invention may comprise an electrically conducting wire 10 with which, in the case of current passage, a magnetic (direct voltage) field can be generated to linearize the transducing characteristic of the magneto-resistance element 3. The components 6 and 7 are of a material having a high magnetic permeability, for example, a nickel-iron alloy having approximately 80 at. % of Ni and 20 at. % of Fe, and are placed so that the component 6 faces the recording medium 2 and the component 7 is coupled to the return limb 4.

Additional advantages resulting from the use of the magnetic flux conductors 6 and 7 are that the magneto-resistance element does not experience any mechanical detrition because it is not placed in direct contact with the moving magnetic recording medium, while temperature fluctuations influencing the electric resistance and, hence, causing noise occur less frequently.

Moreover, the width of the track which is read is better defined as a result of the use of the magnetic flux conductor 6 having a width which is equal to the track width.

The sensor according to the invention can be readily used for a thin-layer construction via suitable masks, which leads to the following multilayer structure comprising a substrate on which are provided successively:
a first layer of magnetically permeable material;
a first insulation layer of quarts;
a magneto-resistance layer;
a second insulation layer of quartz;
a second layer of a magnetically permeable material in two parts separated by an intermediate space which is situated opposite to the central part of the magneto-resistance layer, one of the two parts being connected to the first layer via a connection hole in the quartz layers, the second layer itself including at least two sub-layers separated by an intermediate layer.

It will be obvious to those skilled in the art that numerous variations are possible without thereby departing from the scope of this invention.

Such a magnetic sensor can be made as follows: A nickel-iron layer is sputtered on an oxidized silicon substrate 8 (sputtering capacity: 1.25 W/cm$^2$, 10% bias, argon pressure: 8 millibars) to a thickness of 3.5 μm. This step may be omitted when a wafer of Ni—Zn ferrite having a thickness of, for example, 2 mm is used as a substrate. A desired pattern is etched in the layer 4 by means of photolithographic methods; this in connection with the fact that a large number of sensors are provided at one time on the substrate 8. The edges of the nickel-iron pattern show an angle of inclination of approximately 30° so as to prevent constrictions from being formed during the deposition of subsequent layers. In U.S. Pat. No. 224,400 (hereby incorporated by reference), it is described how the use of a thin top layer enables said etching of inclination angles.

First, a 340 nm thick quartz layer 9 is sputtered over the layer 4 (sputtering capacity: 1 W/cm$^2$, 10% bias, argon pressure: 10 millibars) followed by a conductor layer 10 which may be constructed from several sub-layers (not shown). For the layer 10, for example, first 20 nm of Mo, then 300 nm of Au and finally 100 nm of Mo are sputtered (sputtering capacity: 0.5 W/cm$^2$, argon pressure: 10 millibars).

In the same way as for the layer 9, a layer of quartz 11 having a thickness of 500 nm is sputtered over the layer 10. Magneto-resistive material is then sputtered in a magnetic field to a thickness between 50 nm and 100 nm. The magneto-resistive material is etched to the desired shaped (strip-shaped layer 3) and a layer of aluminium (not shown) is sputtered to a thickness of 200 nm. By means of this layer which is also etched to the desired shape, the necessary connections to an electric circuit are effected. A 500 nm thick layer of quartz 12 is then sputtered after which a connection hole 13 is etched through the quartz layers provided. Flux conductors 6 and 7 are deposited, flux conductor 7 contacting layer 4 at the area of the connection hole 13, so that the layers 6, 7 and 4 form a magnetic circuit. The flux conductors 6 and 7 have been given a desired shape by means of photolithographic methods. This is characterized by a gap 15 opposite to the sensor of the magneto-resistance layer 3. In order to produce a maximum flux transfer from and to the strip 3, the edges of the gap have a certain inclination. Both the connections of the magneto-resistance strip 3 and the connections of the conductor 10 which may serve to generate a magnetic bias field upon energization, can be made thicker, if necessary, by means of sputtering or electroplating methods in order to reduce their ohmic resistance and to provide more easily connections to an external electric circuit.

Characteristic of the invention is the laminated structure of the flux conductors 6 and 7 which may be vapor-deposited, sputtered or electroplated. In the case of sputtering, the same procedure is used as in depositing the magneto-resistance layer (sputtering capacity: 1.2 W/cm$^2$, 10 millibars argon pressure). The structure obtained by means of sputtering has, for example, a 150 nm thick layer 16 of NiFe; a 5 nm thick layer 17 of Mo and a 150 nm thick layer 18 of NiFe (FIG. 1, insert A), or four superimposed layers (19, 21, 23, 25) of NiFe having a thickness of 80 nm, separated by three layers (20, 22, 24) of Mo having a thickness of 5 nm (insert B). In the case of electroplating, there are various manners of varying the layer composition during the deposition process. For example, an increase of the current density leads to an increase of the Ni-content in Ni-Fe layers and a shortening of the deposition time leads to an increase of the Fe-content.

It is to be noted that the magneto-resistance strip 3 can be placed not only within the flux conductors 6, 7 as shown in FIG. 1, but also outside the flux conductors 6, 7. This makes it possible to make the gap length, that is the distance between the layers 4 and 6 in the proximity of the recording medium, small in particular smaller than 1 μm.

Figure 2:
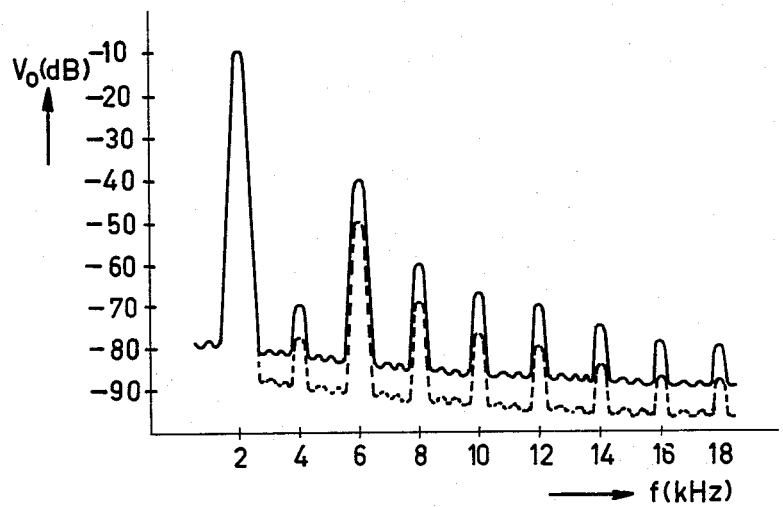

For determining the properties of the magnetic sensor according to the invention, the sensor was subjected to a (simulated) field of a magnetic recording medium (frequency 1 kHz). The higher harmonics in the output signal of the sensor were analyzed by means of a spectrum analyzer and compared with that of a conventional sensor with single layer flux conductors. In both cases, the distance S between the magneto-resistance strip 3 and the flux conductors 6, 7 was approximately 400 nm. The result is shown in FIG. 2 which shows the output signal $V_o$ as a function of the measuring frequency. The top spectrum belongs to the conventional sensor; the bottom spectrum belongs to the sensor according to the invention. It will be obvious that in the latter case both the level of the higher harmonics and the noise level are considerably lower.

What is claimed is:

1. A magnetic sensor, comprising:
   an elongate and generally flat magneto-resistance element which has a magnetic anisotropy in which the easy axis of magnetization lies in the major plane of the element;
   two magnetically permeable components situated in one plane between which components a gap is present, the gap being bridged magnetically by the magneto-resistance element;
   a body of a magnetically permeable material disposed parallel to the two components, the body having one end coupled magnetically to an end of a first of the two components remote from the gap, an end of the second magnetically permeable component remote from the gap being adapted to be brought in a flux coupling relationship with an external magnetic field, characterized in that
   each magnetically permeable component includes at least two parallel layers of magnetically permeable materials each having substantially a first composition, and that an intermediate layer having a composition different from the first composition is present between the two parallel layers.

2. A sensor as claimed in claim 1, characterized in that the intermediate layer has a thickness not greater than 10 nm.

3. A sensor as claimed in claim 1 or 2, characterized in that the intermediate layer is formed of a non-magnetic material.

4. A sensor as claimed in claim 3, characterized in that the intermediate layer of non-magnetic material consists of Mo.

5. A sensor as claimed in claim 1 or 2, characterized in that the two parallel layers of magnetically permeable materials consist of a Ni—Fe alloy having a first Ni/Fe ratio, and that the intermediate layer consists of a Ni—Fe alloy having a second Ni/Fe ratio.

* * * * *